United States Patent
Miyake et al.

(10) Patent No.: US 7,673,205 B2
(45) Date of Patent: Mar. 2, 2010

(54) SEMICONDUCTOR IC AND TESTING METHOD THEREOF

(75) Inventors: Naomi Miyake, Osaka (JP); Yoshirou Nakata, Kyoto (JP)

(73) Assignee: Panasonic Corporation, Osaka (JP)

( * ) Notice: Subject to any disclaimer, the term of this patent is extended or adjusted under 35 U.S.C. 154(b) by 293 days.

(21) Appl. No.: 11/819,598

(22) Filed: Jun. 28, 2007

(65) Prior Publication Data
US 2008/0098267 A1 Apr. 24, 2008

(30) Foreign Application Priority Data
Oct. 20, 2006 (JP) .............................. 2006-285604

(51) Int. Cl.
*G01R 31/28* (2006.01)
(52) U.S. Cl. .................. 714/729; 714/738; 714/724; 714/741; 714/726; 714/736; 714/727; 714/25; 714/30; 714/732; 714/734; 714/819; 324/757; 324/758; 324/763
(58) Field of Classification Search .................. None
See application file for complete search history.

(56) References Cited

U.S. PATENT DOCUMENTS

| | | | |
|---|---|---|---|
| 6,996,758 B1* | 2/2006 | Herron et al. ............... 714/726 |
| 7,353,440 B2* | 4/2008 | Ohwada et al. ............. 714/726 |
| 7,412,639 B2* | 8/2008 | Volkerink et al. ........... 714/736 |
| 2001/0046168 A1* | 11/2001 | Barth et al. ................. 365/201 |
| 2003/0011396 A1* | 1/2003 | Takagi ........................ 324/765 |
| 2003/0221152 A1* | 11/2003 | Volkerink et al. ........... 714/736 |
| 2004/0003329 A1* | 1/2004 | Cote et al. .................. 714/726 |
| 2004/0246337 A1* | 12/2004 | Hasegawa et al. ........... 348/189 |
| 2006/0282732 A1* | 12/2006 | Kiryu .......................... 714/738 |

FOREIGN PATENT DOCUMENTS

JP 2000-227458 8/2000

* cited by examiner

*Primary Examiner*—John P Trimmings
(74) *Attorney, Agent, or Firm*—Steptoe & Johnson LLP (57) ABSTRACT

According to the present invention, the outputs of the last scanning flip-flop circuits 12 included in scan chains 111 are compiled and compressed in an output compression circuit 112, a sum of the outputs from the scan chains 111 and an expected value written in an expected value storage circuit 113 from the outside are compared with each other in an expected value decision circuit 114, the sum being outputted from the output compression circuit 112, a pass/fail decision result obtained by the comparison can be outputted from an output terminal 116 of the expected value decision circuit 114 to the outside, and the decision result can be stored regardless of the reset of a system.

1 Claim, 10 Drawing Sheets

SEMICONDUCTOR IC AND TESTING METHOD THEREOF

FIELD OF THE INVENTION

The present invention relates to a semiconductor IC in a semiconductor test process of performing burn-in and a test using probes for collectively testing a wafer, and a method of testing a semiconductor IC.

BACKGROUND OF THE INVENTION

Conventionally, in order to screen out defective products produced in the early stages of manufacturing processes, accelerated tests are performed on semiconductor devices and wafers by operating the semiconductor devices and wafers at high temperatures and high voltages. Such operations are called burn-in.

In recent years, techniques for collectively performing burn-in at a wafer level (hereinafter, will be referred to as wafer-level burn-in) have been frequently performed. In wafer-level burn-in, tests are conducted by operating devices while inputting high voltages and signals to the power supply electrodes and the plurality of input/output electrodes of the devices.

On the other hand, in semiconductor ICs, as tests become complicated and the number of pins increases with higher levels of integration achieved by finer processes, DFT (Design for Test) techniques have been developed as circuit designs for facilitating tests. BIST (Built-in self test) circuits have been also installed as self-test circuits.

These test facilitating techniques greatly contribute to a reduction in the number of pins in wafer-level tests. In recent years, in combination of these techniques with probing techniques for wafer-level burn-in, attempts have been made to collectively perform wafer tests or tests on package conditions at a wafer level.

Figure 5:
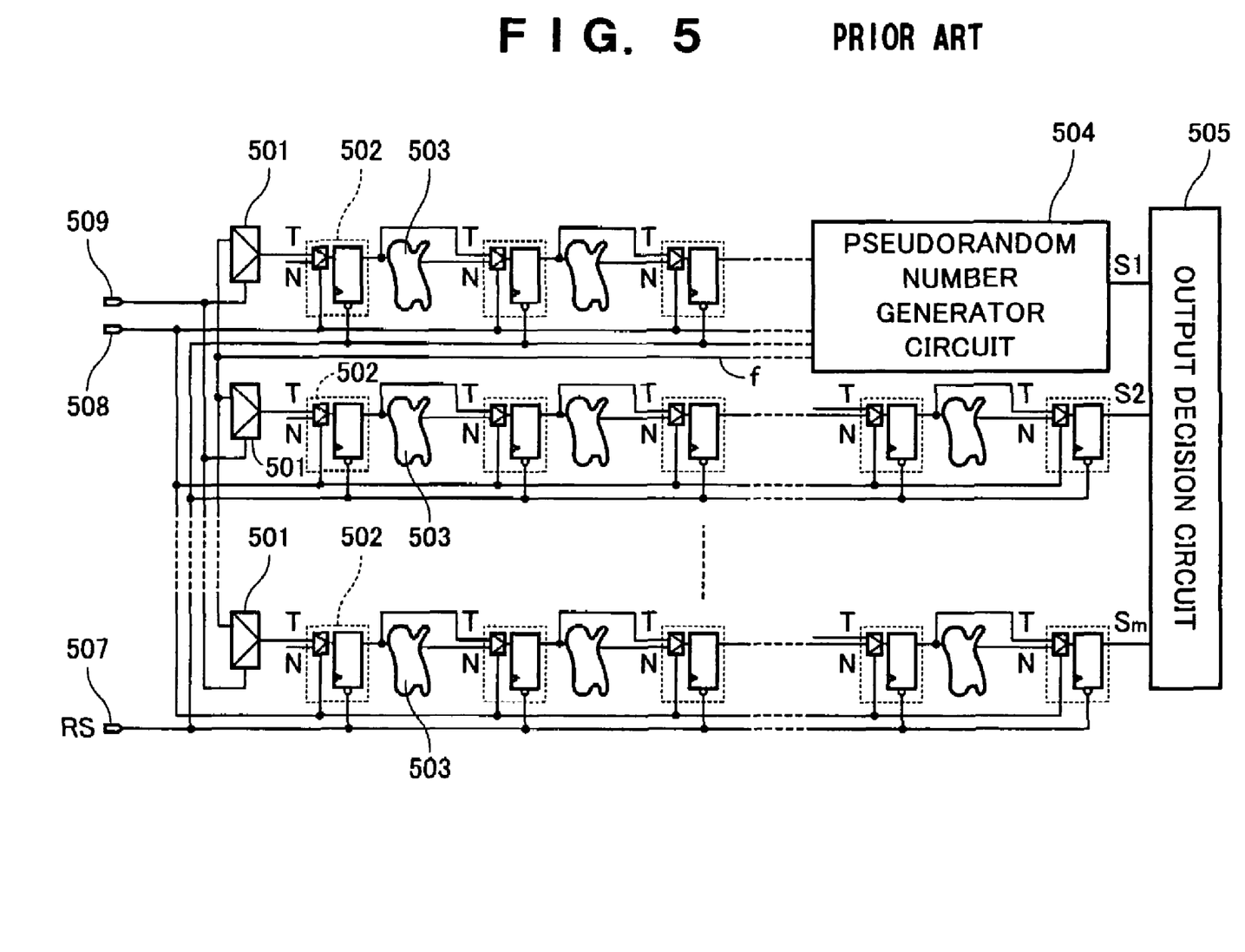
FIG. 5 is a block diagram showing DFT in a conventional semiconductor IC.

Referring to FIG. 5, a configuration for DFT in conventional wafer-level burn-in will be described below (for example, see Japanese Patent Laid-Open No. 2000-227458).

FIG. 5 is a circuit diagram showing the configuration for DFT in a conventional semiconductor IC. In FIG. 5, reference numeral 501 denotes burn-in mode selector circuits, reference numeral 502 denotes scanning flip-flop circuits, reference numeral 503 denotes combinational circuits, reference numeral 504 denotes a pseudorandom number generator circuit, reference numeral 505 denotes an output decision circuit, reference numeral 507 denotes a reset terminal fed with a reset signal RS from the outside, reference numeral 508 denotes a scan shift/capture switching terminal, and reference numeral 509 denotes a burn-in mode setting terminal for setting the switching of the burn-in mode selector circuits 501. The clock input terminals of the scanning flip-flop circuits 502 are fed with the same clock (not shown).

The semiconductor IC of FIG. 5 has first to m-th scan chain holding sections having the plurality of combinational circuits 503 and the plurality of scanning flip-flop circuits 502. Reference numerals S1, S2, ..., Sm respectively denote the outputs of the scanning flip-flop circuits 502 of the final stages in the first, second, ..., m-th scan chain holding sections.

In the conventional example, the pseudorandom number generator circuit 504 is designed in the first scan chain holding section. As shown in FIG. 5, an output signal f generated in the pseudorandom number generator circuit 504 is supplied through the burn-in mode selector circuits 501 to the inputs of the scanning flip-flop circuits 502 in the first stages of all the scan chain holding sections.

With this configuration, it is possible to supply random numbers to all the scan chain holding sections and apply a proper stress to the overall circuit during a burn-in test. Further, pseudorandom numbers generated inside eliminate the need for scan input from the outside, so that the semiconductor IC can be operated with a small number of terminals.

Figure 6:
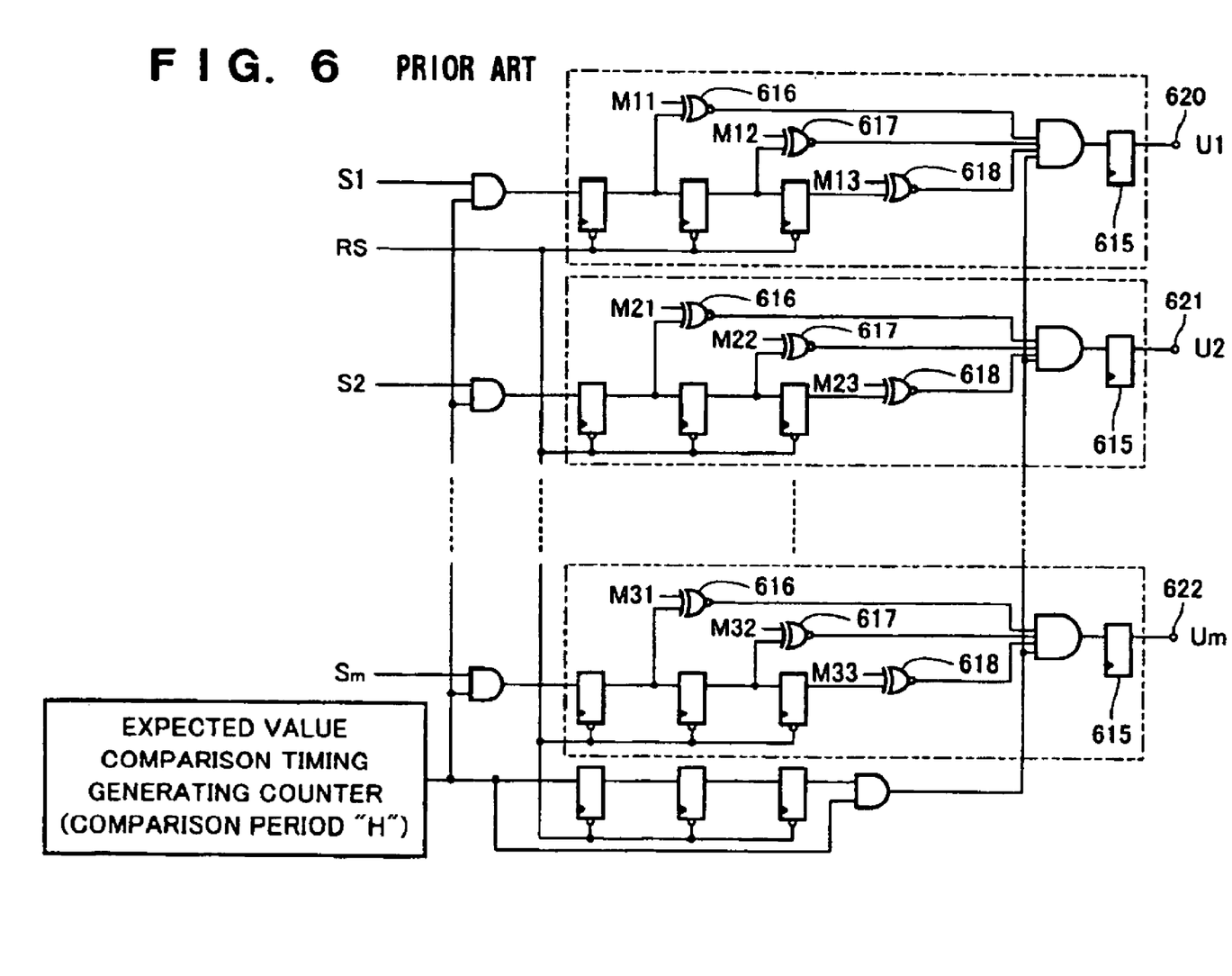
FIG. 6 is a circuit diagram showing a specific example of an output decision circuit of DFT in the conventional semiconductor IC.

The output decision circuit 505 is specifically configured as shown in FIG. 6. The output decision circuit 505 monitors, for each fixed period of time, the output signals S1, S2, ..., Sm of the scanning flip-flop circuits 502 in the final stages of the scan chain holding sections, and the output decision circuit 505 outputs decision signals U1, U2, ... Um as output signals indicating the states of the circuit when a stress is improperly applied or the circuit fails and malfunctions.

At comparisons in EX-NOR circuits 616, 617 and 618, expected values M11 to M23 are set and the expected values of the output signals S1 to Sm are calculated and set beforehand by simulation.

According to the conventional example, when a plurality of scan chains are configured to make a scan design, one of the scan chain holding sections has the pseudorandom number generator circuit 504 and the output signal f of the pseudorandom number generator circuit 504 is supplied to the inputs of the scanning flip-flop circuits 502 in the first stages of all the scan chain holding sections, so that random numbers can be supplied to all the scan chain holding sections and a proper stress can be applied to the overall circuit during a burn-in test.

Further, since the output decision circuit 505 is provided, it is possible to decide whether or not a stress is properly applied and the circuit normally operates without failures during a burn-in test, improve the reliability of a reliability test, and prevent a defective chip from being brought as it is to the subsequent step.

Figure 7:
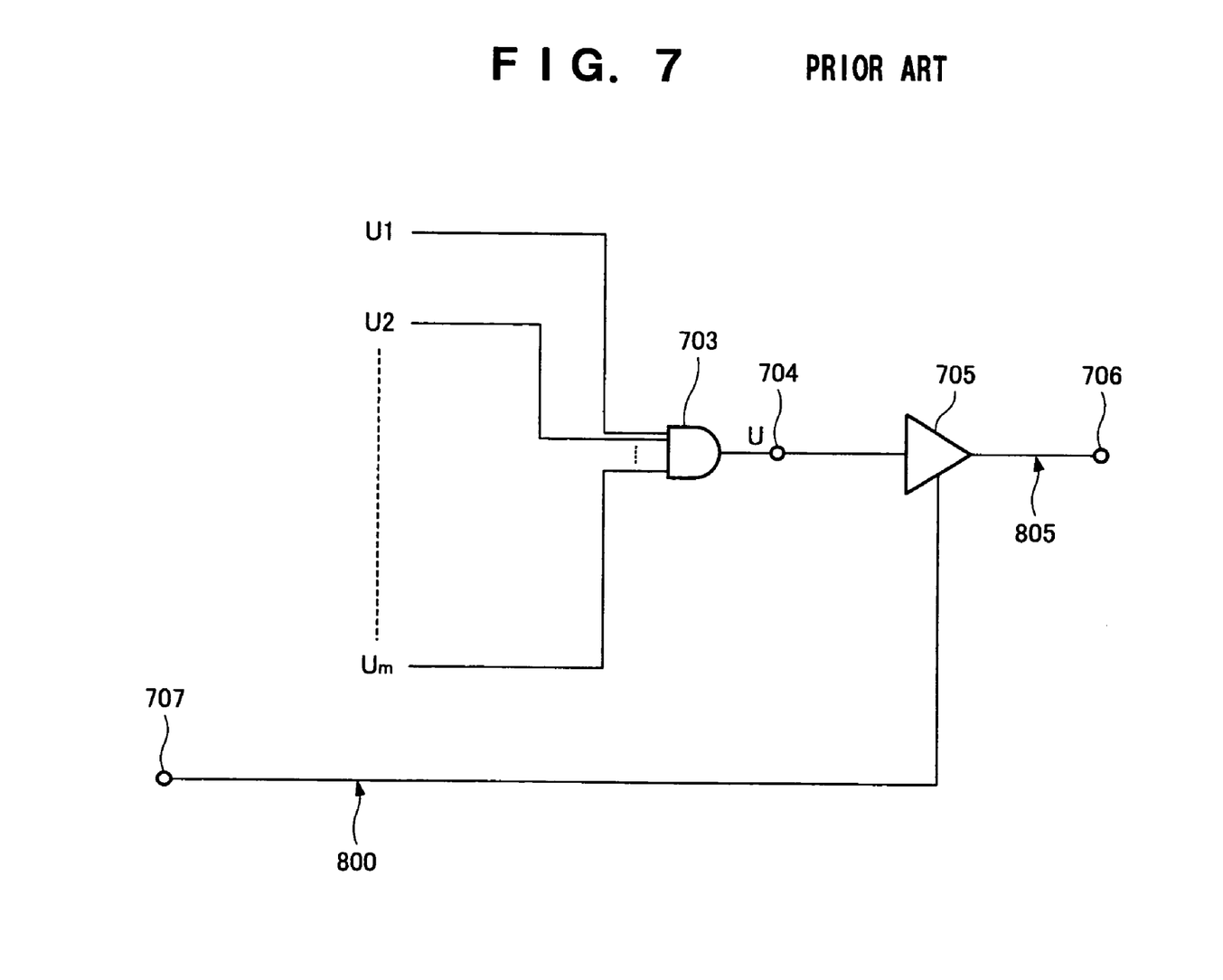
FIG. 7 is a circuit diagram showing a part of an output decision circuit of DFT in the conventional semiconductor IC.

In the output decision circuit 505 of the conventional example, as shown in FIG. 6, the decision signals U1 to Um are outputted from decision signal output terminals 620 to 622, respectively. The decision signal output terminals 620 to 622 may not be provided. As shown in FIG. 7, the decision signals U1 to Um outputted from flip-flop circuits 615 may be inputted to an AND circuit 703 and the output of the AND circuit 703 may be outputted as a decision signal U from a single decision signal output terminal 704.

In this case, when the decision signal U is "H", it can be decided that a stress is properly applied and circuits making up the first to m-th scan chain holding sections normally operate without failures. When the decision signal U is "L", it can be decided that a stress is not properly applied or a failure occurs in the circuits making up the first to m-th scan chain holding sections. Instead of the AND circuit 703, a NAND circuit may be provided. In this case, the decisions about "H" and "L" of the decision signal U are reversed.

Further, wafer-level burn-in is characterized in that a wafer is contacted and operated in a collective manner. However, some burn-in devices have just a few comparators for receiving decision signals. Thus in many cases, a circuit connected via a tristate buffer 705 having an output control signal 800 from an output control terminal 707 as an input is installed as a circuit for controlling an output, in order to enable a tester to receive the decision signals in a plurality of times even when just a few comparators are provided.

Figure 8:
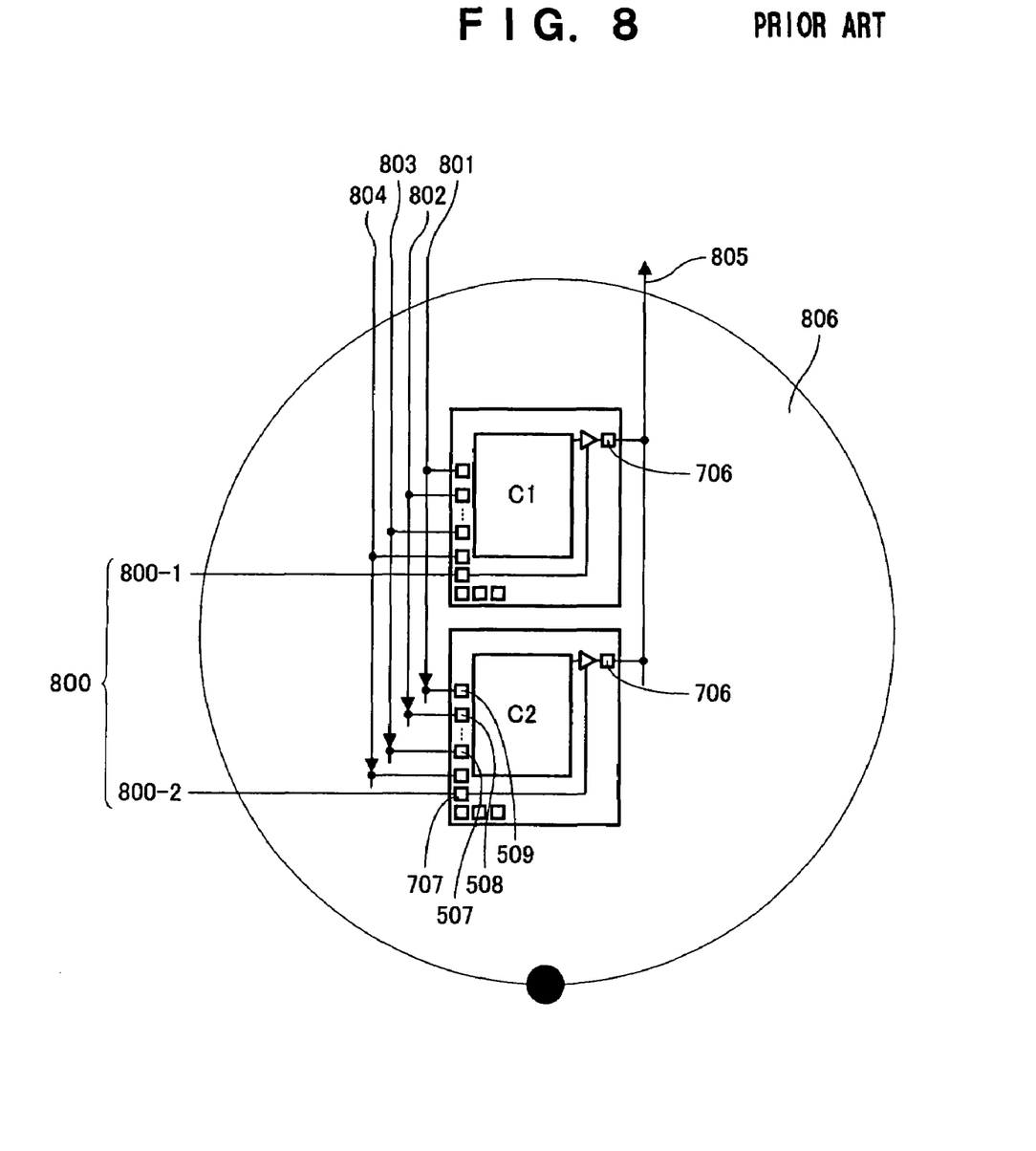
FIG. 8 is an explanatory drawing showing a method of testing the conventional semiconductor IC.

Referring to FIG. 8, the following will describe a conventional method for performing a burn-in test simultaneously on a wafer including the semiconductor IC. A technique of simultaneously making contact with a wafer has been realized by Matsushita Electric Industrial Co., Ltd. as probes and the like having a three-layer structure for simultaneously making contact with the wafer. In FIG. 8, it is assumed that two semiconductor ICs C1 and C2 of a plurality of semiconductor ICs configured on a wafer are simultaneously operated.

In FIG. 8, reference numeral 507 denotes the reset terminal of FIG. 5, reference numeral 508 denotes the scan shift/capture switching terminal of FIG. 5, reference numeral 509 denotes the burn-in mode setting terminal of FIG. 5, and reference numeral 707 denotes the output control terminal fed with the output control signal 800 for controlling the output of the tristate buffer 705 of FIG. 7. The output of C1 is controlled by an output control signal 800-1 inputted to the output control terminal 707 on the side of C1, and the output of C2 is controlled by an output control signal 800-2 inputted to the output control terminal 707 on the side of C2.

Reference numerals 801 to 804 denote signals connected to the two semiconductor ICs in a shared manner. Reference numeral 801 denotes a burn-in mode setting signal connected to the burn-in mode setting terminals 509 of C1 and C2 and supplied from the tester to a wafer 806 as a signal for setting the burn-in modes of the semiconductor ICs. Reference numeral 802 denotes a scan shift/capture switching signal connected to the scan shift/capture switching terminals 508 of C1 and C2 and supplied from the tester to the wafer 806 as a signal for setting the scanning operations of the semiconductor ICs. Reference numeral 803 denotes a reset signal connected to the reset terminals 507 of C1 and C2 and supplied from the tester to the wafer 806 as a signal for initializing the semiconductor ICs. Reference numeral 804 denotes a reference clock connected from the corresponding terminals of C1 and C2 to the clock input terminals of the scanning flip-flop circuits in C1 and C2. The reference clock 804 is supplied from the tester to the wafer 806 as a reference signal of the operation timing of the semiconductor ICs. Reference numeral 805 denotes a pass/fail output signal connected to output terminals 706 (see FIG. 7) of C1 and C2. The pass/fail output signals 805 are transferred from the wafer 806 to the tester as signals indicating decision results respectively outputted from C1 and C2.

With this configuration, the plurality of semiconductor ICs on the wafer can be collectively operated in response to the signals 801 to 804.

Further, in order to confirm whether or not C1 has been correctly operated, the output control signal 800-1 to the output control terminal 707 is initially controlled such that the output control signal 800-1 to the output control terminal 707 for C1 is enabled. At this moment, the output control signal 800-2 is controlled such that the output control signal 800-2 to the output control terminal 707 for C2 is disabled. After an initial reset in response to the reset signal 803 to the reset terminals 507 in the signal conditions of the output control signals 800-1 and 800-2 to the output control terminals 707, the reference clock 804 is supplied and a burn-in test is conducted. The results of the burn-in test are collected in the AND circuit of FIG. 7 and outputted after a decision in the output decision circuit 505.

Thus it is possible to confirm whether or not C1 has been correctly operated.

Further, in order to confirm whether or not C2 has been correctly operated, the output control signal 800-2 to the output control terminal 707 is initially controlled such that the output control signal 800-2 to the output control terminal 707 for C2 is enabled. At this moment, the output control signal 800-1 is controlled such that the output control signal 800-1 to the output control terminal 707 for C1 is disabled. After an initial reset in response to the reset signal 803 to the reset terminals 507 in the signal conditions of the output control signals 800-1 and 800-2 to the output control terminals 707, the reference clock 804 is supplied and a burn-in test is conducted. The results of the burn-in test are collected in the AND circuit of FIG. 7 and outputted after a decision in the output decision circuit 505.

In the conventional example, the wafer made up of the two semiconductor ICs was described. For n semiconductor ICs, the foregoing contents are repeated n times to confirm operations on the overall wafer.

Figure 10:
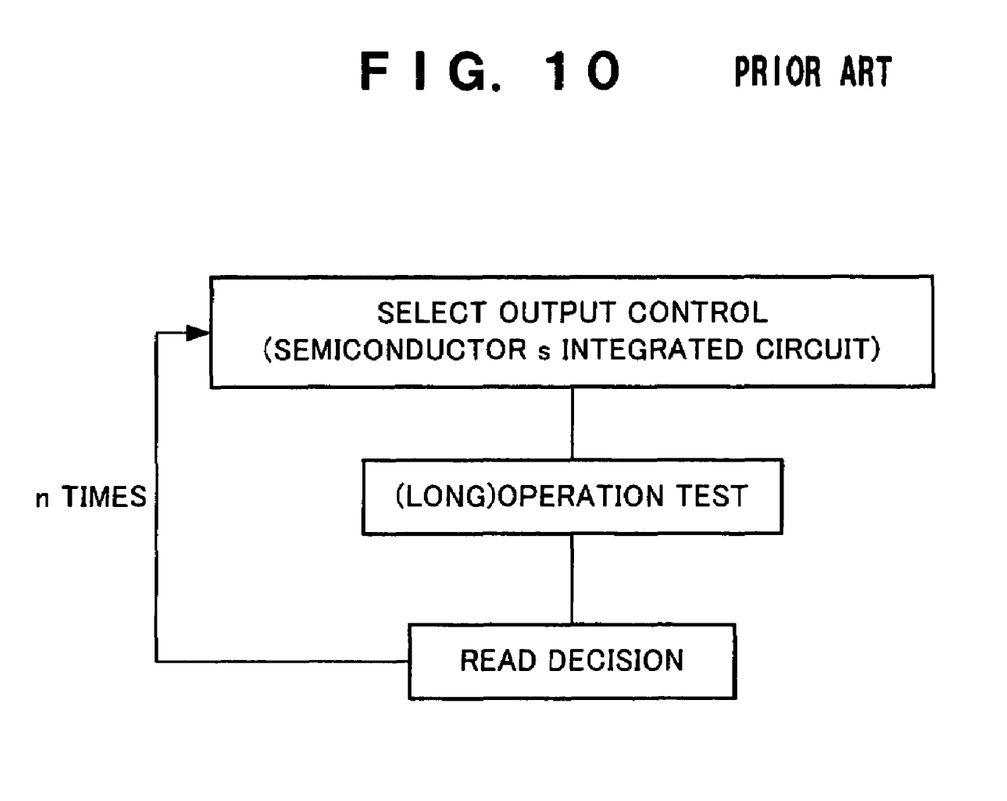
FIG. 10 is a flowchart showing the method of testing the conventional semiconductor IC.

As described above, as a flow of confirming whether an operation is correct or not, as shown in FIG. 10, the following is repeated n times: output control is enabled for a semiconductor IC to be confirmed, an operation test is conducted, and then a decision is read, so that operations on the overall wafer are confirmed.

Figure 9:
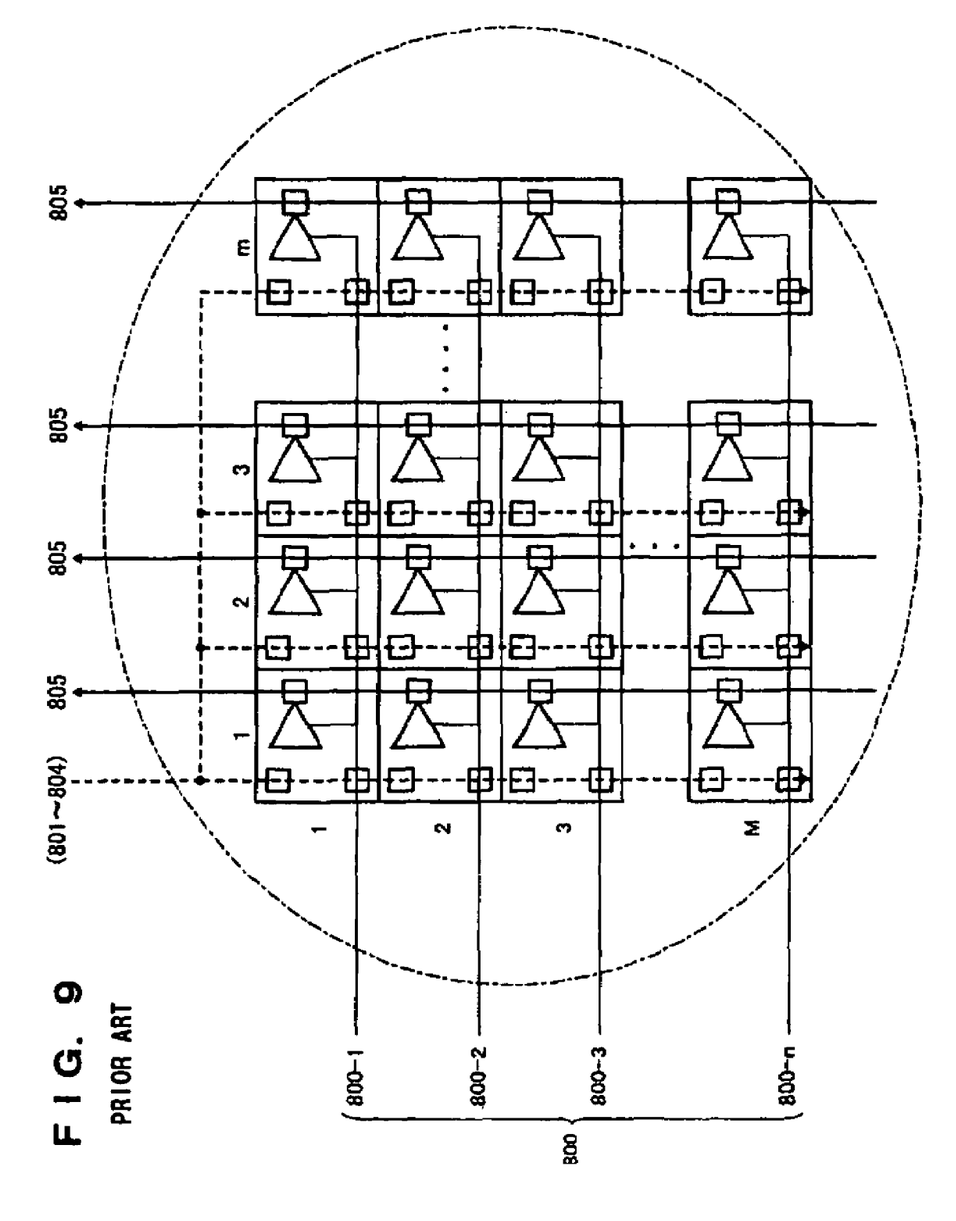
FIG. 9 is another explanatory drawing showing the method of testing the conventional semiconductor IC.

In the conventional example, the two semiconductor ICs C1 and C2 are connected to single wiring for outputting the pass/fail output signal 805 from the output terminal 706. In reality, semiconductor ICs are configured in a plurality of rows and columns on a wafer and thus generally, a plurality of rows and columns (m, M) shown in FIG. 9 are connected via wiring.

As described above, with the configuration of the conventional semiconductor ICs, operations can be performed and confirmed with a small number of terminals, so that a wafer burn-in test can be easily conducted simultaneously.

The conventional test facilitating technique greatly contributes to a reduction in the number of pins in wafer-level tests. In recent years, in combination with probing techniques for wafer-level burn-in having been applied to mass production, attempts have been made to collectively perform wafer tests or tests on package conditions at a wafer level.

However, in the foregoing semiconductor ICs, expected values are set inside for the output decision circuit for deciding whether the semiconductor IC is acceptable or not. Thus in the event of wrong simulation results during the design of the semiconductor IC, redesign is necessary.

Moreover, during wafer burn-in, operations have to be performed not in a collective manner but in blocks to confirm the operations. Further, the semiconductor IC has to be operated for each decision, resulting in a long test time.

DISCLOSURE OF THE INVENTION

The present invention solves the foregoing conventional problems and has as its object the provision of a semiconductor IC and a method of testing the semiconductor IC by which expected values for output decision can be inputted without increasing the number of terminals, the design can be facilitated, a test pattern can be expanded, and a test time can be shortened.

In order to solve the problem, a semiconductor IC according to the present invention includes combinational circuits, a plurality of scan chains, an output compression circuit fed with the outputs of the last ones of scanning flip-flop circuits included in the scan chains, and compiling the outputs of the scan chains, an expected value storage circuit capable of writing an expected value from the outside, and an expected value decision circuit fed with an output compressed by the output compression circuit and the expected value of the expected value storage circuit, wherein the expected value decision circuit has the function of comparing the compressed output of the output compression circuit and the expected value of the expected value storage circuit and outputting a decision result from an output terminal to the outside.

Further, a semiconductor IC according to the present invention includes combinational circuits, a plurality of scan chains, an output compression circuit fed with the outputs of the last ones of scanning flip-flop circuits included in the scan chains, and compiling the outputs of the scan chains, an expected value storage circuit capable of writing an expected value from the outside, and an expected value decision circuit fed with an output compressed by the output compression circuit and the expected value of the expected value storage circuit, wherein the expected value storage circuit writes the expected value from the outside through the input terminal of the scan chain, and the expected value decision circuit has the function of comparing the compressed output of the output compression circuit and the expected value of the expected value storage circuit and outputting a decision result from an output terminal to the outside.

Moreover, a semiconductor IC according to the present invention includes combinational circuits, a plurality of scan chains, an output compression circuit fed with the outputs of the last ones of scanning flip-flop circuits included in the scan chains, and compiling the outputs of the scan chains, an expected value storage circuit capable of writing an expected value from the outside, and an expected value decision circuit fed with an output compressed by the output compression circuit and the expected value of the expected value storage circuit, wherein the expected value storage circuit writes the expected value from the outside through the output terminal of the expected value decision circuit, and the expected value decision circuit has the function of comparing the compressed output of the output compression circuit and the expected value of the expected value storage circuit and outputting a decision result from an output terminal to the outside.

Furthermore, a semiconductor IC according to the present invention includes combinational circuits, a plurality of scan chains, an output compression circuit fed with the outputs of the last ones of scanning flip-flop circuits included in the scan chains, and compiling the outputs of the scan chains, an expected value storage circuit capable of writing an expected value from the outside, and an expected value decision circuit fed with an output compressed by the output compression circuit and the expected value of the expected value storage circuit, wherein the expected value decision circuit has an initializing terminal provided for the decision circuit, and has the function of keeping storing a decision result until the decision circuit receives an initialization command and the function of outputting the decision result in response to an output command.

A method of testing a semiconductor IC according to the present invention, in which on a wafer having the plurality of semiconductor ICs formed thereon, a semiconductor tester having test probe card is used in simultaneously testing an electrical characteristic of the plural semiconductor ICs formed on the wafer, the method including: simultaneously supplying one of a plurality (group) of voltages and a plurality (group) of signals to the test probes in contact with the test terminals of the semiconductor ICs to simultaneously test the plurality of semiconductor ICs on the wafer, and simultaneously monitoring the outputs of at least one of the semiconductor ICs after the testing step, wherein every time one of the voltage and the signal is collectively supplied to the test probes along with the monitoring step to conduct a test, decision results on the semiconductor ICs are outputted to a pass/fail decision receiving section of the semiconductor tester.

As described above, according to the present invention, the outputs of the last scanning flip-flop circuits included in the scan chains are compiled and compressed in the output compression circuit, a sum of the outputs from the scan chains and an expected value written in the expected value storage circuit from the outside are compared with each other in the expected value decision circuit, the sum being outputted from the output compression circuit, a decision result obtained by the comparison can be outputted from the one output terminal of the expected value decision circuit to the outside, and the decision result can be stored regardless of the reset of a system.

For this reason, it is possible to input expected values for output decision from the outside without increasing the number of terminals, facilitate the design, expand a test pattern without reducing contact collectively made on a wafer, and shorten a time period for confirming an operation.

DESCRIPTION OF THE EMBODIMENTS

Semiconductor ICs illustrating embodiments of the present invention and a method of testing the semiconductor ICs will now be specifically described with reference to the accompanying drawings.

First Embodiment

First Embodiment of the present invention relates to a semiconductor IC specifically described below with reference to FIG. 1.

Figure 1:
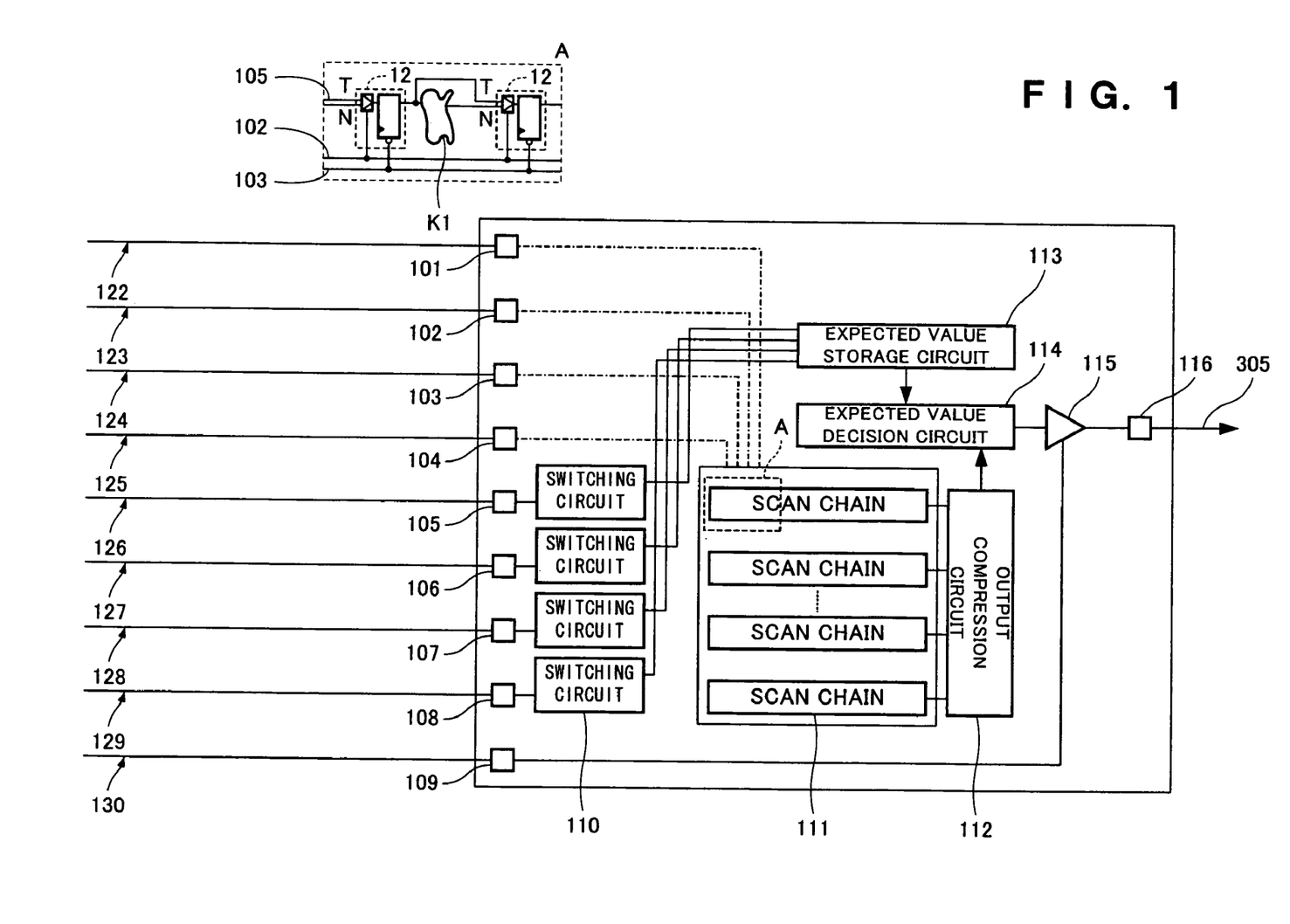
FIG. 1 is a block diagram showing the configuration of a semiconductor IC according to First and Third Embodiments of the present invention.

In FIG. 1, reference numeral 101 denotes a test mode setting terminal, reference numeral 102 denotes a scan shift/capture switching terminal, reference numeral 103 denotes a reset terminal, reference numeral 104 denotes a reference clock input terminal, reference numerals 105 to 108 denote expected value input/scan input terminals, reference numeral 109 denotes an output control terminal, reference numeral 110 denotes switching circuits for switching an expected value input and a scan input, reference numeral 111 denotes scan chains, reference numeral 112 denotes an output compression circuit, reference numeral 113 denotes an expected value storage circuit, reference numeral 114 denotes an expected value decision circuit, reference numeral 115 denotes a tristate buffer having an output control signal from the output control terminal 109 as an input, and reference numeral 116 denotes an output terminal.

The semiconductor IC includes the plurality of scan chains 111. The respective scan chains 111 have, as indicated by a block A, a plurality of combinational circuits K1 and a plurality of scanning flip-flop circuits 12 with the combinational circuits K1 interposed between the flip-flop circuits 12.

During a scan test conducted on the semiconductor IC, the respective scan chains 111 are fed with the scan input signals of expected value input/scan input signals 126 to 129 from the expected value input/scan input terminals 105 to 108 through the respective switching circuits 110.

Further, the scanning flip-flop circuits 12 in the scan chains 111 are set at one of a shift mode and a capture mode in response to a scan shift/capture switching signal inputted from the scan shift/capture switching terminal 102. In the shift mode, the scanning flip-flop circuit 12 is fed with a signal of a shifting operation through a data path T. In the capture mode, the scanning flip-flop circuit 12 is fed with a signal of a normal operation through a data path N including the combinational circuit K1.

On the other hand, the expected value storage circuit 113 is fed with the expected value input signals of expected value input/scan input signals 126 to 129 beforehand from the expected value input/scan input terminals 105 to 108 through the switching circuits 110 during the scan test conducted on the semiconductor IC, and the expected value storage circuit 113 stores, as an expected value, a logical value to be obtained by compilation and compression in the output compression circuit 112 during a pass/fail decision of the semiconductor IC.

In this case, when the scan test is conducted on the semiconductor IC, the expected value input/scan input terminals 105 to 108 are first connected to the expected value storage circuit 113 via the switching circuits 110. And then, the above expected values are transferred beforehand as the expected value input signals of the expected value input/scan input signals 126 to 129 from the expected value input/scan input terminals 105 to 108 to the expected value storage circuit 113 through the switching circuits 110.

Next, a reference clock 125 is inputted from the outside through the reference clock input terminal 104, and the respective scan chains 111 are fed with the scan input signals of the expected value input/scan input signals 126 to 129 from the expected value input/scan input terminals 105 to 108 through the respective switching circuits 110 in synchronization with the reference clock 125, so that the combinational circuits K1 of the semiconductor IC are activated and the test is conducted.

From the final stage of the scan chains, unique "H" or "L" values are sequentially outputted in synchronization with the reference clock 125. These outputs are compressed by the output compression circuit 112 on a time base. The output compression circuit 112 includes, for example, a space compactor/multi-input shift register (MISR) for analyzing a signature.

Next, the logical value obtained upon decision is transferred from the output compression circuit 112 to the expected value decision circuit 114. The expected value decision circuit 114 compares the expected value stored in the expected value storage circuit 113 and the output from the output compression circuit 112, decides whether or not the semiconductor IC is acceptable in terms of electrical operations according to the matching of the values, and outputs the decision result as a pass/fail output signal 305 from the output terminal 116 to the outside through the tristate buffer 115.

As described above, according to the present embodiment, the expected value input/scan input terminals 105 to 108 are used and the expected values are inputted from the outside to the expected value storage circuit 113 through the expected value input/scan input terminals 105 to 108 and the switching circuits 110, so that the operation of the semiconductor IC can be confirmed and a pass/fail decision can be made on the semiconductor IC.

Thus it is possible to input the expected values from the outside without increasing the number of terminals of the semiconductor IC and reduce mistakes in design as compared with the case where expected values are provided beforehand in the semiconductor IC.

Moreover, in the present embodiment, the expected values are inputted in parallel from the scan input terminals to the expected value storage circuit 113, thereby achieving a high-speed operation.

Second Embodiment

Second Embodiment of the present invention relates to a semiconductor IC specifically described below with reference to FIG. 2.

Figure 2:
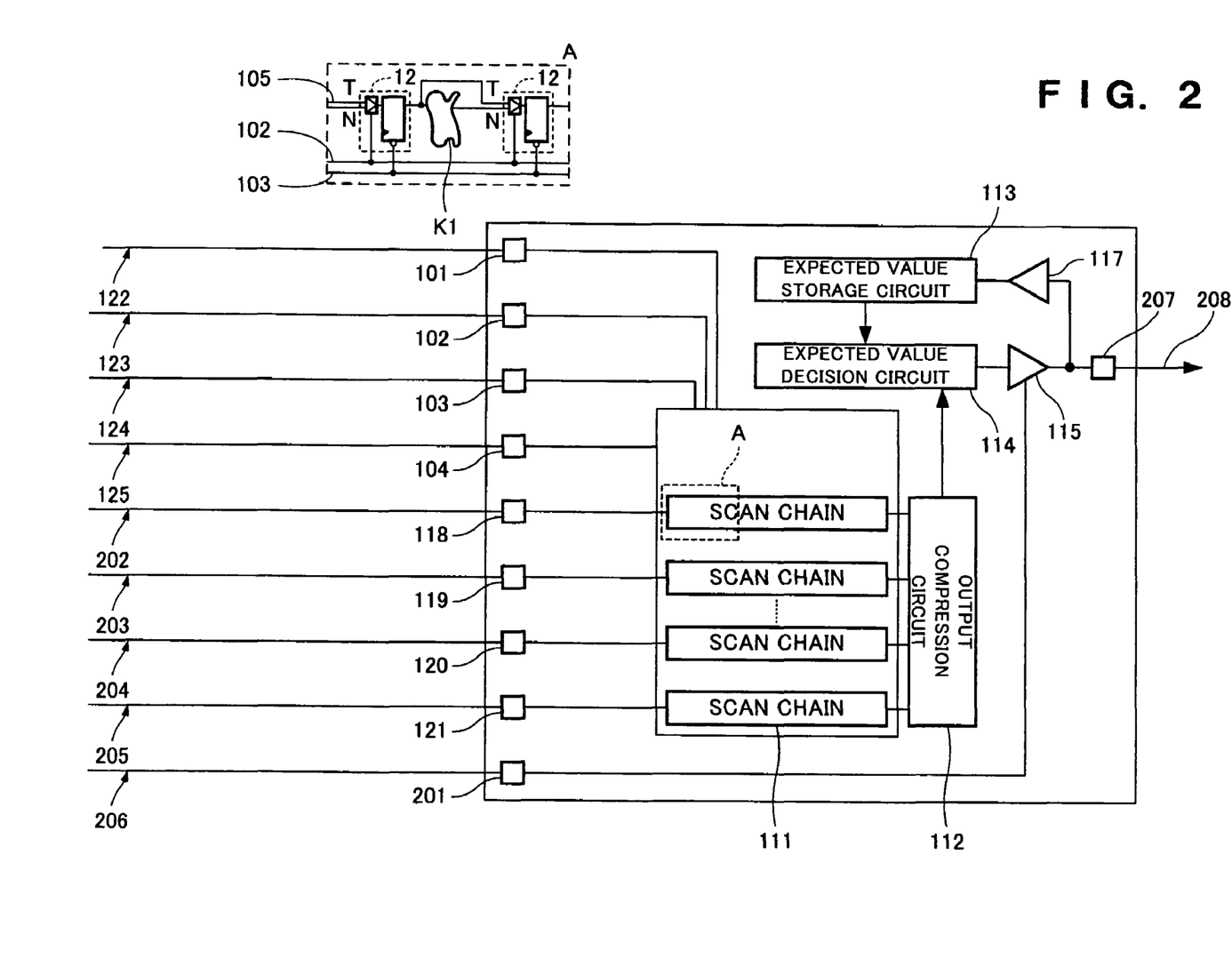
FIG. 2 is a block diagram showing the configuration of a semiconductor IC according to Second and Third Embodiments of the present invention.

In FIG. 2, reference numeral 101 denotes a test mode setting terminal, reference numeral 102 denotes a scan shift/capture switching terminal, reference numeral 103 denotes a reset terminal, reference numeral 104 denotes a reference clock input terminal, reference numerals 118 to 121 denote scan input terminals, reference numeral 201 denotes an input/output control terminal, reference numeral 111 denote scan chains, reference numeral 112 denotes an output compression circuit, reference numeral 113 denotes an expected value storage circuit, reference numeral 114 denotes an expected value decision circuit, reference numeral 115 denotes a tristate buffer having an input/output control signal 206 from an input/output control terminal 201 as an input, reference numeral 207 denotes an input/output terminal, and reference numeral 117 denotes an expected value input buffer.

The semiconductor IC includes the plurality of scan chains 111. The respective scan chains 111 have, as indicated by a block A, a plurality of combinational circuits K1 and a plurality of scanning flip-flop circuits 12 with the combinational circuits K1 interposed between the flip-flop circuits 12.

During a scan test conducted on the semiconductor IC, the respective scan chains 111 are fed with scan input signals 202 to 205 through the scan input terminals 118 to 121.

Further, the scanning flip-flop circuits 12 in the scan chains 111 are set in one of a shift mode and a capture mode in response to a scan shift/capture switching signal inputted from the scan shift/capture switching terminal 102. In the shift mode, the scanning flip-flop circuit 12 is fed with a signal of a shifting operation through a data path T. In the capture mode, the scanning flip-flop circuit 12 is fed with a signal of a normal operation through a data path N having the combinational circuit K1.

On the other hand, the expected value storage circuit 113 is fed with the expected value input signal of an expected value input/evaluation output signal 208 beforehand from the input/output terminal 207 through the expected value input buffer 117 during the scan test conducted on the semiconductor IC, and the expected value storage circuit 113 stores, as an expected value, a logical value to be obtained by compilation and compression in the output compression circuit 112 during a pass/fail decision of the semiconductor IC.

In this case, when the scan test is conducted on the semiconductor IC, the input/output control signal 206 from the input/output control terminal 201 is first disabled to stop the operation of the tristate buffer 115, and an expected value, as a logical value, to be obtained by compilation and compression in the output compression circuit 112 during a pass/fail decision of the semiconductor IC is transferred beforehand to the expected value storage circuit 113 from the input/output terminal 207 through the expected value input buffer 117.

Next, a reference clock 125 is inputted from the outside through the reference clock input terminal 104, and the respective scan chains 111 are fed with the scan input signals 202 to 205 through the scan input terminals 118 to 121 in synchronization with the reference clock 125, so that the combinational circuits K1 of the semiconductor IC are activated and the test is conducted.

From the final stage of the scan chains, unique "H" or "L" values are sequentially outputted in synchronization with the reference clock 125. These outputs are compressed by the output compression circuit 112 on a time base. The output compression circuit 112 includes, for example, a space compactor/multi-input shift register (MISR) for analyzing a signature.

Next, the logical value upon decision is transferred from the output compression circuit 112 to the expected value decision circuit 114. The expected value decision circuit compares the expected value stored in the expected value storage circuit 113 and the output from the output compression circuit 112, decides whether or not the semiconductor IC is acceptable in terms of electrical operations according to the matching of the values, and outputs the decision result as a pass/fail output signal of the expected value input/evaluation output signal 208 from the input/output terminal 207 to the outside through the tristate buffer 115.

As described above, according to the present embodiment, the input/output terminal 207 is used and the expected values are inputted from the outside to the expected value storage circuit 113 through the input/output terminal 207 and the expected value input buffer 117, so that the operation of the semiconductor IC can be confirmed and a pass/fail decision can be made on the semiconductor IC.

Thus it is possible to input the expected values from the outside without increasing the number of terminals of the semiconductor IC and reduce mistakes in design as compared with the case where expected values are provided beforehand in the semiconductor IC.

Third Embodiment

Third Embodiment of the present invention relates to a semiconductor IC having the function of enabling the expected value decision circuit 114 of FIGS. 1 and 2 to keep storing decision results described in First and Second Embodiments even when this system is reset by a scan reset signal and the like (not described in First and Second Embodiments).

In this case, for example, the function of keeping storing decision results described in First and Second Embodiments may be implemented as follows: for example, a reset signal for the expected value decision circuit 114 may be separated from a reset signal for the overall system to reset the expected value decision circuit 114 separately from the system, and the expected value decision circuit 114 may be reset by inputting the reset signal only when the stored decision results have to be deleted, for example, when the decision results are not necessary any more or have to be forcibly deleted. Alternatively, the expected value decision circuit 114 may be caused to store the decision results until the decision results are overwritten with new decision results, regardless of the input of the reset signal of the overall system.

Further, in the semiconductor IC of the present embodiment, the expected value decision circuit 114 has the function of optionally outputting decision results stored thus, in response to an output command from the outside.

In order to realize this function, for example, one of the output control signal 130 of First Embodiment and the input/output control signal 206 of Second Embodiment may be used in the semiconductor IC. By inputting these control signals, stored decision results may be optionally outputted to the outside according to the signal conditions of the control signals.

As described above, the decision results can be stored in the expected value decision circuit regardless of the reset of the system and the output of the decision results can be controlled, thereby considerably reducing a time period for confirming whether or not operations have been performed during a wafer-level burn-in test. In Fourth Embodiment, a test method applied during the wafer-level burn-in test will be specifically described. The test method is applied when the decision results of the expected value decision circuit are stored during an operation.

Fourth Embodiment

Fourth Embodiment of the present invention relates to a semiconductor IC specifically described below with reference to FIG. 3. A method of simultaneously making contact with a wafer has been realized by Matsushita Electric Industrial Co., Ltd. as probes and the like having a three-layer structure for simultaneously making contact with the wafer. Further, in FIG. 3, it is assumed that two semiconductor ICs C1 and C2 are simultaneously operated of a plurality of semiconductor ICs configured on a wafer.

Figure 3:
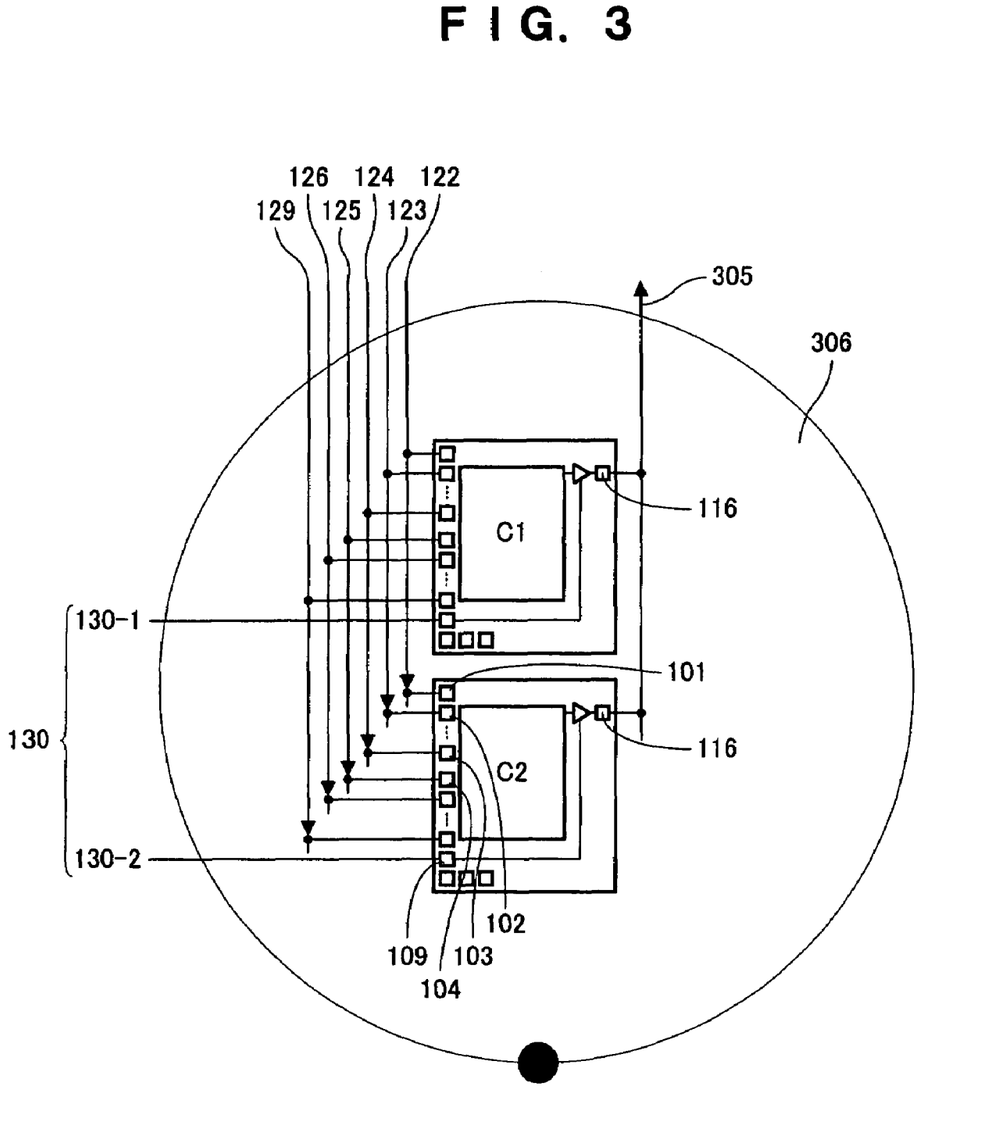
FIG. 3 is an explanatory drawing showing a method of testing a semiconductor IC according to Fourth Embodiment of the present invention.

In FIG. 3, reference numeral 101 denotes the test mode setting terminal of FIGS. 1 and 2, reference numeral 102 denotes the scan shift/capture switching terminal of FIGS. 1 and 2, reference numeral 103 denotes the reset terminal of FIGS. 1 and 2, reference numeral 104 denotes the reference clock input terminal of FIGS. 1 and 2, and reference numeral 109 denotes the output control terminal for controlling the tristate buffer 115 for controlling output in FIG. 1. The output of C1 is controlled by an output control signal 130-1 inputted to the output control terminal 109 on the side of C1, and the output of C2 is controlled by an output control signal 130-2 inputted to the output control terminal 109 on the side of C2.

Moreover, signals 122 to 125 and 126 to 129 are connected and inputted in a shared manner from an external tester to the plurality of semiconductor ICs including C1 and C2. Reference numeral 122 denotes a test mode setting signal connected to the test mode setting terminals 101 of C1 and C2 and supplied from the external tester to a wafer 306 as a signal for setting burn-in and a test mode in the semiconductor ICs. Reference numeral 123 denotes a scan shift/capture switching signal connected to the scan shift/capture switching terminals 102 of C1 and C2 and supplied from the external tester to the wafer 306 as a signal for performing the scanning operations of the semiconductor ICs. Reference numeral 124 denotes a reset signal connected to the reset terminals 103 of C1 and C2 and supplied from the external tester to the wafer 306 as a signal for initializing the semiconductor ICs. Reference numeral 125 denotes a reference clock connected from the reference clock input terminals 104 of C1 and C2 to the clock input terminals of scanning flip-flop circuits in C1 and C2. The reference clock 125 is supplied from the external tester to the wafer 306 as a reference signal of the operation timing of the semiconductor ICs.

Reference numeral 305 denotes a pass/fail output signal connected to output terminals 116 of C1 and C2 and transferred from the wafer 306 to the external tester as a signal indicating decision results respectively outputted from C1 and C2.

With this configuration, the plurality of semiconductor ICs on the wafer can be collectively operated in response to the signals 122 to 125 and 126 to 129.

In this case, in order to confirm whether or not C1 has been correctly operated, the input of the output control signal 130-1 is controlled so as to enable the signal condition of output in the output control terminal 109 on the side of C1. At this moment, the input of the output control signal 130-2 is controlled so as to disable the signal condition of output in the output control terminal 109 on the side of C2.

In the conditions of the output control signals 130-1 and 130-2, only a reading operation is performed without a testing operation. The result of a burn-in test is outputted after a decision is made in the expected value decision circuit 114. Thus it is possible to confirm in a short time whether or not C1 has been correctly operated.

Next, in order to confirm whether or not C2 has been correctly operated, the input of the output control signal 130-2 is controlled so as to enable the signal condition of output in the output control terminal 109 on the side of C2. At this moment, the input of the output control signal 130-1 is controlled so as to disable the signal condition of the output in the output control terminal 109 on the side of C1.

In the signal conditions of the output control signals 130-1 and 130-2, only a reading operation is performed without a testing operation. The result of a burn-in test is outputted after a decision is made in the expected value decision circuit 114. Thus it is possible to confirm in a short time whether or not C2 has been correctly operated.

In the present embodiment, only the two semiconductor ICs C1 and C2 are collectively operated out of the plurality of semiconductor ICs configured on the wafer. When the number of the arranged semiconductor ICs is n, the foregoing contents are repeatedly performed n times to confirm the operations of the overall wafer.

Figure 4:
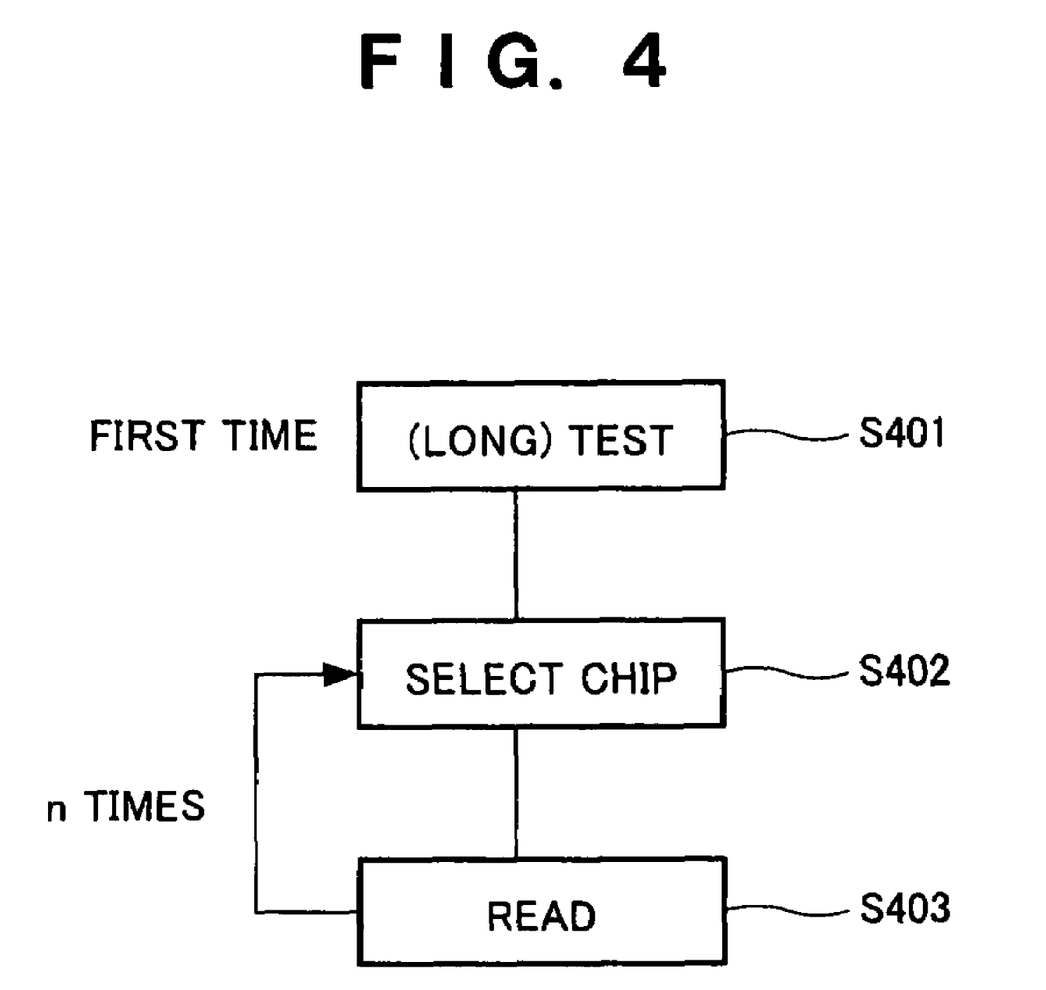
FIG. 4 is a flowchart showing the method of testing the semiconductor IC of Fourth Embodiment.

In a flow of confirming whether or not the operations of the plurality of semiconductor ICs configured on the wafer are correct, as shown in FIG. 4, an electrical operation test requiring a long processing time is performed on the overall wafer (step S401), and then the following processing is repeated n times: semiconductor ICs (chips) to be confirmed are selected (step S402) and output control signals for the semiconductor ICs are enabled to read a decision result (step S403), so that the operations of the overall wafer are confirmed.

In this way, the semiconductor IC for storing expected values of an expected value storage circuit during an operation is used and a test is conducted according to the present embodiment, thereby considerably reducing a time period for confirming whether or not an operation has been performed during a wafer-level burn-in test.

When a time period required for an internal scan test is 1 s, a time period for deciding an expected value is 100 µs, and n is 2, the conventional example shown in FIGS. 8 and 10 has the following relationship:

$$(1s+100 \text{ µs}) \times 2 \text{ times} = 2.0002 \text{ s}.$$

According to the present invention, the following relationship is established:

$$1s + 100 \text{ µs} \times 2 \text{ times} = 1.0002 \text{ s}.$$

As is evident from this result, as the number of n times of decision increases, the effect of the present invention is enhanced.

What is claimed is:

1. A semiconductor IC, comprising:
   combinational circuits;
   a plurality of scan chains;
   an output compression circuit fed with outputs of last ones of scanning flip-flop circuits included in the scan chains, and compiling outputs of the scan chains;
   an expected value storage circuit capable of writing an expected value from outside; and
   an expected value decision circuit fed with an output compressed by the output compression circuit and the expected value of the expected value storage circuit;
   wherein the expected value storage circuit writes the expected value from the outside through an output terminal of the expected value decision circuit; and
   the expected value decision circuit has a function of comparing the compressed output of the output compression circuit and the expected value of the expected value storage circuit and outputting a decision result from the output terminal to the outside.

* * * * *